United States Patent
Xie et al.

(10) Patent No.: US 6,981,231 B2
(45) Date of Patent: Dec. 27, 2005

(54) SYSTEM AND METHOD TO REDUCE LEAKAGE POWER IN AN ELECTRONIC DEVICE

(75) Inventors: Weize Xie, Cupertino, CA (US); Norman Chang, Fremont, CA (US); Shen Lin, Foster City, CA (US); Osamu Samuel Nakagawa, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 181 days.

(21) Appl. No.: 10/079,508

(22) Filed: Feb. 22, 2002

(65) Prior Publication Data

US 2003/0163792 A1 Aug. 28, 2003

(51) Int. Cl.[7] .............................................. G06F 17/50
(52) U.S. Cl. .............................................. 716/2; 716/6
(58) Field of Search ...................................... 716/2, 6

(56) References Cited

U.S. PATENT DOCUMENTS

| | | | |
|---|---|---|---|
| 5,880,967 A * | 3/1999 | Jyu et al. ..................... 716/6 |
| 6,090,153 A * | 7/2000 | Chen et al. ..................... 716/8 |
| 6,111,427 A * | 8/2000 | Fujii et al. ..................... 326/34 |
| 6,209,122 B1 * | 3/2001 | Jyu et al. ..................... 716/6 |
| 6,253,351 B1 * | 6/2001 | Fukui et al. ..................... 716/2 |
| 6,253,358 B1 * | 6/2001 | Takahashi ..................... 716/6 |
| 6,304,998 B1 * | 10/2001 | Kamiya et al. ............... 716/4 |
| 6,487,701 B1 * | 11/2002 | Dean et al. ..................... 716/4 |
| 6,519,748 B2 * | 2/2003 | Sakamoto ..................... 716/6 |
| 6,591,402 B1 * | 7/2003 | Chandra et al. ............... 716/5 |
| 6,668,358 B2 * | 12/2003 | Friend et al. ................... 716/2 |
| 6,687,883 B2 * | 2/2004 | Cohn et al. ..................... 716/4 |
| 6,728,941 B2 * | 4/2004 | Chen ............................. 716/5 |
| 2002/0002701 A1 * | 1/2002 | Usami et al. ................... 716/8 |
| 2002/0141234 A1 * | 10/2002 | Kaviani ..................... 365/181 |
| 2003/0163792 A1 * | 8/2003 | Xie et al. ..................... 716/4 |

* cited by examiner

Primary Examiner—Stacy A. Whitmore
(74) Attorney, Agent, or Firm—Richard P. Lange

(57) ABSTRACT

A system and method to reduce leakage power consumption of electronic devices. In addition to assigning threshold voltages, sizes of the transistors within the device may be varied to provide a range of options to meet the timing requirements while minimizing the leakage power consumption.

14 Claims, 5 Drawing Sheets

SYSTEM AND METHOD TO REDUCE LEAKAGE POWER IN AN ELECTRONIC DEVICE

FIELD OF THE INVENTION

This invention relates generally to reducing leakage power consumed in electronic devices. More particularly, the invention relates to simultaneous dual threshold voltage assignments and sizing of gates in electronic devices to reduce leakage power while meeting the timing requirements.

BACKGROUND OF THE INVENTION

In modem miniaturized circuit devices, the trend is toward faster processing speeds. One only has to look at microprocessors to realize this is true. Also, due to the proliferation of portable devices such as laptops, the trend is also toward minimizing power consumption.

Regarding the processing speed, faster operation may be achieved by lowering the threshold voltage of the transistors of devices. When the threshold voltage of a transistor is lowered, the drive current capability of the transistor increases, which increases the operational speed of the transistor.

However, lowering the threshold voltage has the drawback of increasing the leakage current of the transistor as well, which in turn increases the leakage power consumed. The leakage power (product of leakage current and supply voltage) may increase exponentially in relation to the reduction in the threshold voltage. As a result, lowering of the threshold voltage to increase the processing speed may result in an undesirable increase in the standby power consumption. For example, at submicron fabrication levels, the leakage power may be 20% or more of the total power consumed.

To minimize any increase in leakage current, dual threshold voltage assignments for transistors are typically used to fabricate devices. In this conventional method, each transistor of the device is designed to be a normal threshold voltage transistor or as a low threshold voltage transistor.

Whether a particular transistor is designed to be a normal or low threshold transistor may depend on the criticality of the transistor. The transistor may be deemed critical if a timing tolerance is below a predetermined level. To illustrate, assume the following: 1) a transistor X feeds a signal to a transistor Y; 2) for reliability purposes, the transistor Y requires a minimum of 5 nanoseconds before its output can be guaranteed; and 3) design requires the signal from Y to be outputted within 10 nanoseconds input of a signal to X. If a normal threshold voltage transistor's propagation from input to output ranges from 4–8 nanoseconds and transistor X is a normal threshold voltage transistor, then the transistor Y would have a range of 6 to 2 nanoseconds to generate a result signal. Clearly, the transistor X cannot be guaranteed to meet the 5 nanosecond minimum requirement of the transistor Y, and thus X may be deemed critical.

The critical transistors may be designed to be low threshold voltage transistors to meet the timing requirements. The remaining transistors, i.e. non-critical transistors, may be designed to be normal threshold transistors to minimize leakage power.

However, the conventional method fails to take into account other design considerations which may meet the timing requirements and at the same time, also reduce leakage power consumed.

SUMMARY OF THE INVENTION

According to an embodiment of the present invention, a method to reduce leakage power in an electronic device includes grouping transistors of the device into units, determining timing requirements for each unit, and assigning a threshold voltage and a fabrication width for one or more transistors of one or more units based on the timing requirements for each unit.

According to another embodiment of the present invention, a method to reduce leakage power in an electronic device includes determining timing requirements for one or more transistors of the device, and assigning a threshold voltage and a fabrication width for each of the one or more transistors whose timing requirements have been determined so that timing requirements are met while leakage power is minimized.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the principles of the present invention are described by referring mainly to an exemplary embodiment or embodiments of schemes for transistor dual voltage assignments. However, it should be understood that the same principles are equally applicable to, and can be implemented in, many types of situations where devices are designed for both speed and minimum power consumption, and that any such variation does not depart from the true spirit and scope of the present invention.

Moreover, in the following detailed description, references are made to the accompanying figures, which illustrate specific embodiments in which the present invention may be practiced. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

In one embodiment of the present invention, timing requirements are met while minimizing the leakage power consumption of a device by considering both the threshold voltage and a fabrication width of the transistors of the device. As described above, the threshold voltage has an impact on the current drive capability of a transistor, but it also has an impact on the leakage power consumed. In general, a low threshold voltage transistor has a higher drive current capability than a normal threshold voltage transistor, assuming that the fabrication width of the transistors are substantially the same.

However, the current drive capability of a transistor may also be increased by increasing the size of the transistor. In VLSI design, this translates to increasing the width of fabrication. For example, a field effect transistor (FET) may be normally fabricated with a width of 0.3 μm. However, the width may be increased to 0.4–0.5 μm range representing 33%–66% variation.

Thus, instead of fabricating a low threshold transistor, it may be possible to design a normal threshold transistor with a wider fabrication width instead to meet the timing requirements. These "overdrive normal threshold" (ONT) transistors may consume slightly more power than the regular normal threshold (RNT) transistors but may also consume much less power than the regular low threshold (RLT) transistors.

Figure 1:
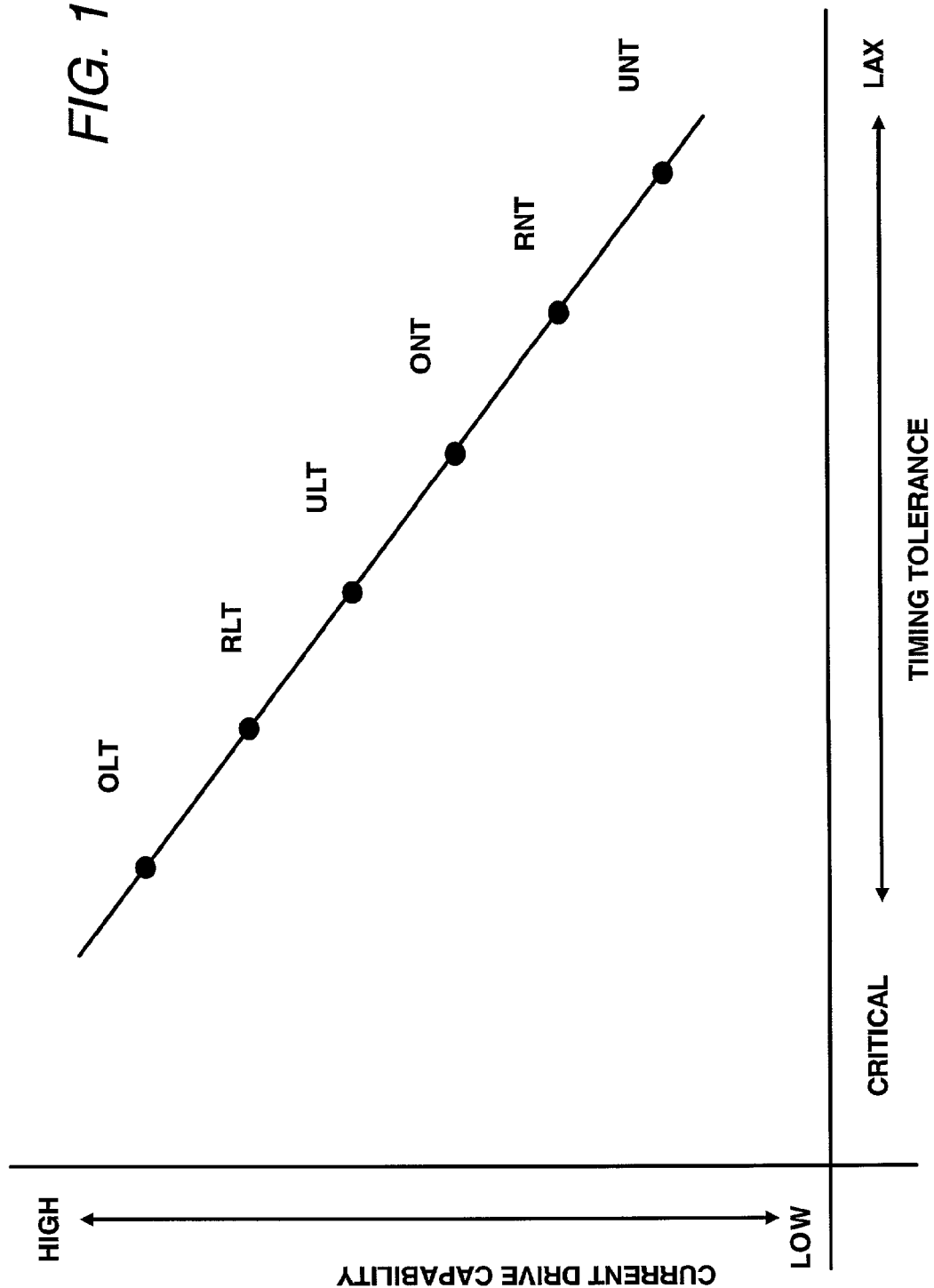
FIG. 1 depicts an exemplary graph showing a relationship between timing requirements and current drive capability of transistors.

FIG. 1 depicts a graph showing an exemplary relationship between timing requirements and current drive capability of transistors. As shown, more critical the timing requirement, higher current drive capability is required. However, higher drive capability translates to more leakage power consumed. Also depicted in FIG. 1 are the overdrive low threshold (OLT) transistor, underdrive low threshold (ULT) transistor, and the underdrive normal threshold (UNT) transistor. However, it is important to realize that the relationship between drive capability and threshold size is on a continuum and is not limited to the six points specifically mentioned.

The ONT transistor may be appropriate in a situation where the RNT transistor does not meet the timing requirements but is fairly close or where the RLT transistor greatly exceed the timing requirements. In such situations, the ONT transistor may provide an alternative to the RLT transistor so that the timing requirements are met while reducing the increase in the leakage power consumed as compared to the RLT transistor.

Just as the width of fabrication may be increased to increase the current drive capability, the width may be reduced to reduce the current drive capability as well. As such, it may be possible to also fabricate the ULT transistors. Because the ULT transistors also lie between the RLT transistors and RNT transistors in terms of power consumption and current drive capability, ULT transistors also provide alternatives.

Indeed, both the ULT transistors and ONT transistors may exist on the same electronic device to provide a range of alternatives to the device designer. In addition, to provide even finer level of control, OLT (overdrive low threshold) transistors and UNT (under-drive normal threshold) transistors may be fabricated on a device. The OLT transistors may be appropriate in situations where timing requirements are extremely critical and the UNT transistors may be appropriate in situations where timing requirements are very lax.

By matching the timing requirements with the appropriate type of transistors, an electronic device may be designed that meet the performance requirements while at the same time, the leakage power consumed is minimized.

Figure 2:
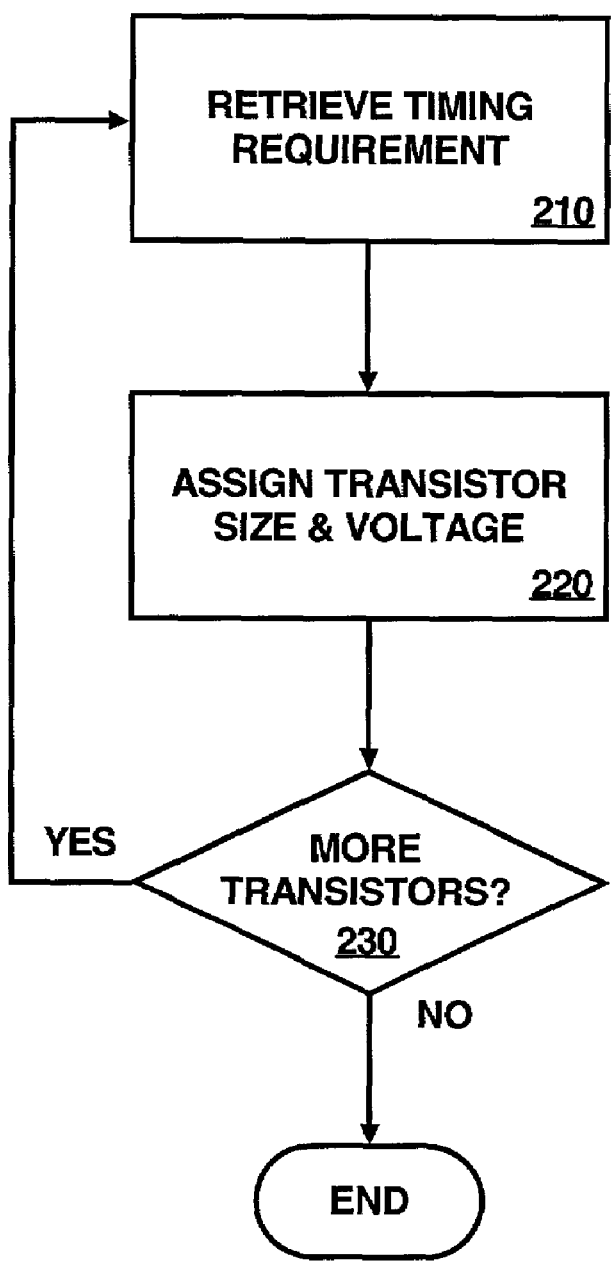
FIG. 2 depicts an exemplary method to design electronic devices to reduce leakage power consumption while meeting the performance requirements.

FIG. 2 depicts an exemplary method 200 to design electronic devices to reduce leakage power consumption while meeting the performance requirements. As shown, the method 200 may determine a timing requirement that should be met by a transistor (step 210). The method 200 may proceed by assigning an appropriate size and threshold voltage to the transistor so that the timing requirement is met while the leakage power consumption is minimized (step 220). If there are more transistors, the process may be repeated. Otherwise, the process may end (step 230).

Note that steps of the method 200 may be modified or deleted, and other steps may be added without departing from the scope of the invention.

Note that it is NOT a requirement that ALL transistors be analyzed. With modem very-large-scale-integration (VLSI) devices, it may be impractical to analyze all transistors of the devices individually. For manageability, a subset of the transistors may be analyzed in detail as described above. The remaining transistors may be divided into other subsets that are defaulted to be a certain type. For example, a design of a device may ensure that timing requirements for a known group of transistors are lax. In this instance, defaulting this group of transistors to be of type RNT or UNT may be appropriate.

Another option to enhance manageability may be to group the transistors within the device into units. For example, all transistors making up an AND gate may be grouped as a unit. Similarly transistors making up a MUX, a NAND gate, OR gate, NOR gate, a latch, a buffer, an inverter, and other simple gates may each be grouped as units as well. Granularities of the units may as course as functional units (cache controller, cache, memory management unit, floating point processor, bus interface, and the like), as fine as a single transistor (individual transistor level), or somewhere in between. After grouping the transistors into units, the timing requirement for each unit may be determined. Then, some or all transistors within the unit may be assigned as appropriate.

Figure 3:
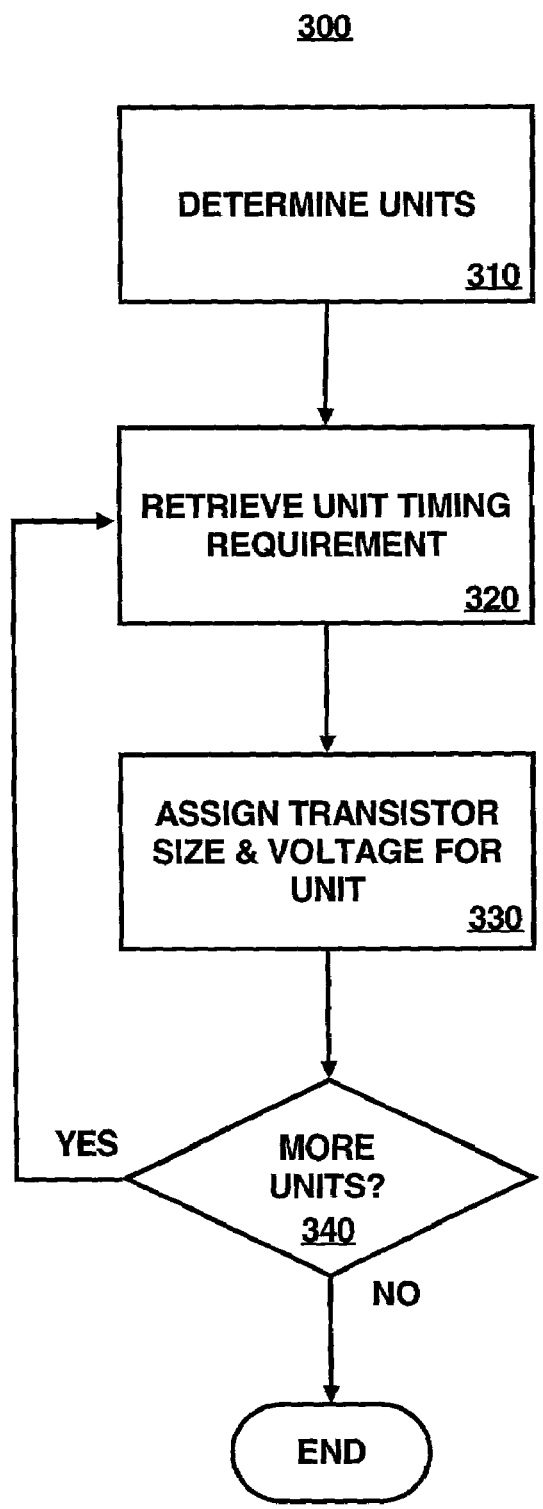
FIG. 3 depicts another exemplary method to design electronic devices to reduce leakage power consumption while meeting the performance requirements.

FIG. 3 depicts another exemplary method 300 to design electronic devices to reduce leakage power consumption while meeting the timing requirements. As shown, the method 300 may define units within a device (step 310). Then the method 300 may determine a timing requirement that should be met by a particular unit (step 320). The method 300 may proceed by assigning an appropriate size and threshold for some or all transistors within the unit so that the timing requirement is met while leakage power consumption is minimized (step 330). If there are more units, the process may be repeated. Otherwise, the process may end (step 340).

Again, the steps of the method 300 may be modified or deleted, and other steps may be added without departing from the scope of the invention. Also, like the situation with the method 200, not all units are required to be analyzed. One or more of the units may be such that one or more transistors of the unit is defaulted to be particular transistor types.

Figure 4:
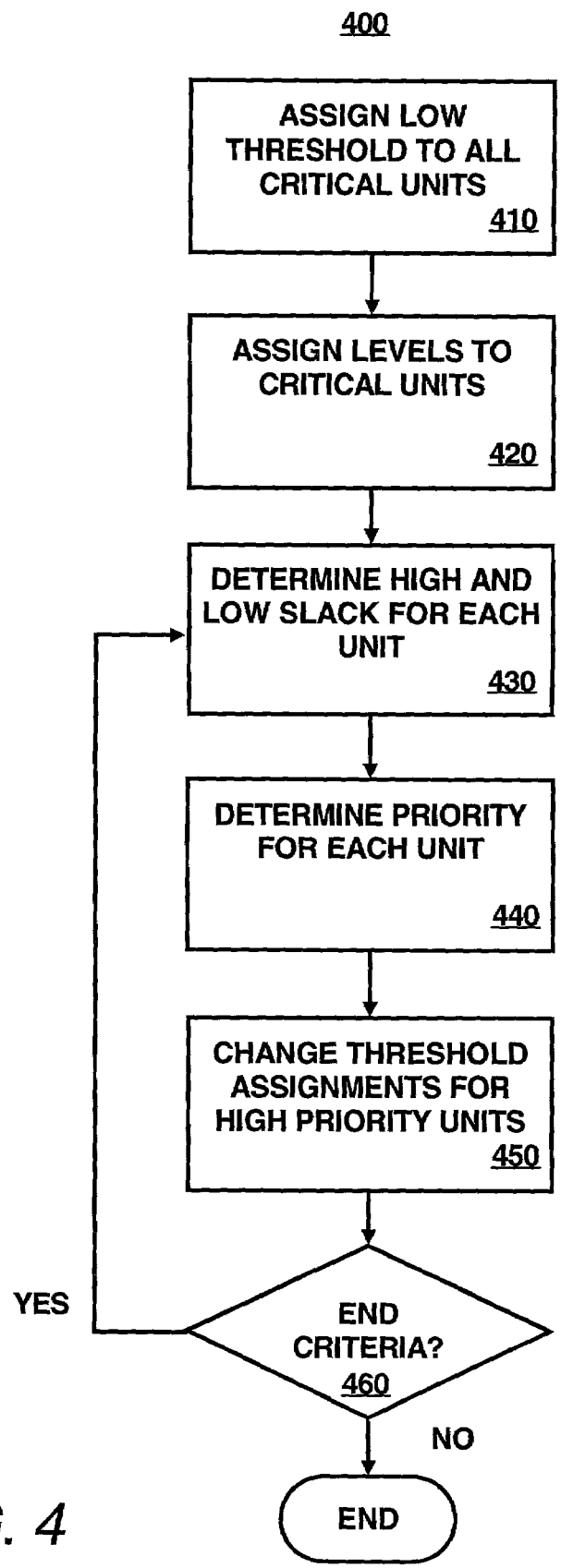
FIG. 4 depicts yet another exemplary method to design electronic devices to reduce leakage power consumption while meeting the performance requirements.

FIG. 4 depicts a further exemplary method 400 to design electronic devices to reduce leakage power consumption while meeting the timing requirements. The method 400 presupposes that certain units are not critical from a timing perspective. In other words, the timing requirements are lax so that normal threshold transistors are sufficient to meet the requirements. These non-critical units may be defaulted to be of type RNT or UNT transistors.

As shown in FIG. 4, the method 400 may initially assign transistors of all critical units to be of type RLT. For each critical unit, the method 400 may assign a level for the selected critical unit (step 420). For example, a chain of units between latches may be assigned to be at a same level. In so doing, the level defines a group of units and/or transistors whose actions must all be accomplished in one clock cycle. In other words, a level defines a chain of units where values from the previous chain (data in previous level latch) are operated upon and made available to the next chain (stored in the current level latch).

Also for each critical unit, the method 400 may determine high and low slacks (step 430). A slack may be determined as follows. The arrival time and departure time at each unit may be calculated from the timing constraints at the primary inputs of the unit. Also, the required time at the inputs and outputs of each unit may be calculated from the timing constraints at the primary inputs of the unit. Then, the slack may be determined by subtracting arrival and departure times from the required times at the inputs and outputs. To determine high slack, one or more transistors of the unit are assigned to be of ONT transistor type prior to the slack calculation. Conversely, to determine the low slack, one or more transistors of the unit are assigned to be of RLT transistor type prior to the calculation.

The method 400 may also determine priorities for each critical unit (step 440). Priority of a unit may be defined as a ratio of the reduction in the leakage power as a result of changing from low threshold transistors (such as RLT) to normal threshold transistors (such as ONT) to the ratio of the slack reduction as a result of the same change. Accordingly, the priority may be defined as:

$$\text{Priority} = (LP_{RLT} - LP_{ONT})/(S_{RLT}/S_{ONT}) \quad (1)$$

where $LP_{RLT}$ and $LP_{ONT}$ are leakage powers for RLT and ONT transistors, respectively, and $S_{RLT}$ and $S_{ONT}$ are the respective slacks.

As defined, higher priority numbers are preferred since they indicate that higher reduction in the leakage power is achievable with less reduction in the slack. Mathematically speaking, the priority number may be negative. This may happen, for example, when the timing requirements cannot be met by switching the unit to be made of ONT transistors. In this instance, the $S_{ONT}$ will be negative, and thus the priority number will be negative as well. However, since low priority numbers are not desirable, the analysis may still be valid.

Then the method 400 may change the transistor assignment of the level of gates with the highest sum of priorities (step 450). For example, the assignment of some or all units within that level may be changed to be of type ONT.

Other criteria to determine which units are reassigned to a new threshold voltage and size specifications. For example, it may be predetermined that a given number of units may be reassigned for each level. In this instance, it is desirable to maximize the sum of priority. In so doing, for a given number of reassignments, maximum benefit may be derived.

Another criteria may that for each level, a particular sum (or percentage) of priority level desired to be reached is predetermined. In this instance, it is desirable to minimize the number of units reassigned while still reaching the goal. In so doing, a particular level of benefits is reached with a minimal number of changes.

Reassigning a level of units may have timing consequences of other device units. Thus, the method 400 determines if an end criteria has been reached (step 460). End criteria may include reaching iteration stability. In other words, the iteration may stop if further iterations will not change transistor assignments. Other criteria may include reaching a predetermined number of iterations, and reaching predetermined leakage power reduction.

While not shown, the method 400 may be modified to start by defaulting the initial assignment of critical transistors to be normal threshold transistors (ONT), and the priority may be redefined accordingly. Then the steps may be modified to reassign the units to be of low threshold transistor types (RLT, ULT, OLT) to reduce the leakage power consumption while meeting the timing requirements.

The methods 200, 300, and 400 may exist in a variety of forms both active and inactive. For example, they may exist as software program(s) comprised of program instructions in source code, object code, executable code or other formats. Any of the above may be embodied on a computer readable medium, which include storage devices and signals, in compressed or uncompressed form. Exemplary computer readable storage devices include conventional computer system RAM (random access memory), ROM (read only memory), EPROM (erasable, programmable ROM), EEPROM (electrically erasable, programmable ROM), flash memory, and magnetic or optical disks or tapes. Exemplary computer readable signals, whether modulated using a carrier or not, are signals that a computer system hosting or running the computer program may be configured to access, including signals downloaded through the Internet or other networks. Concrete examples of the foregoing include distribution of the program(s) on a CD ROM or via Internet download. In a sense, the Internet itself, as an abstract entity, is a computer readable medium. The same is true of computer networks in general.

Figure 5:
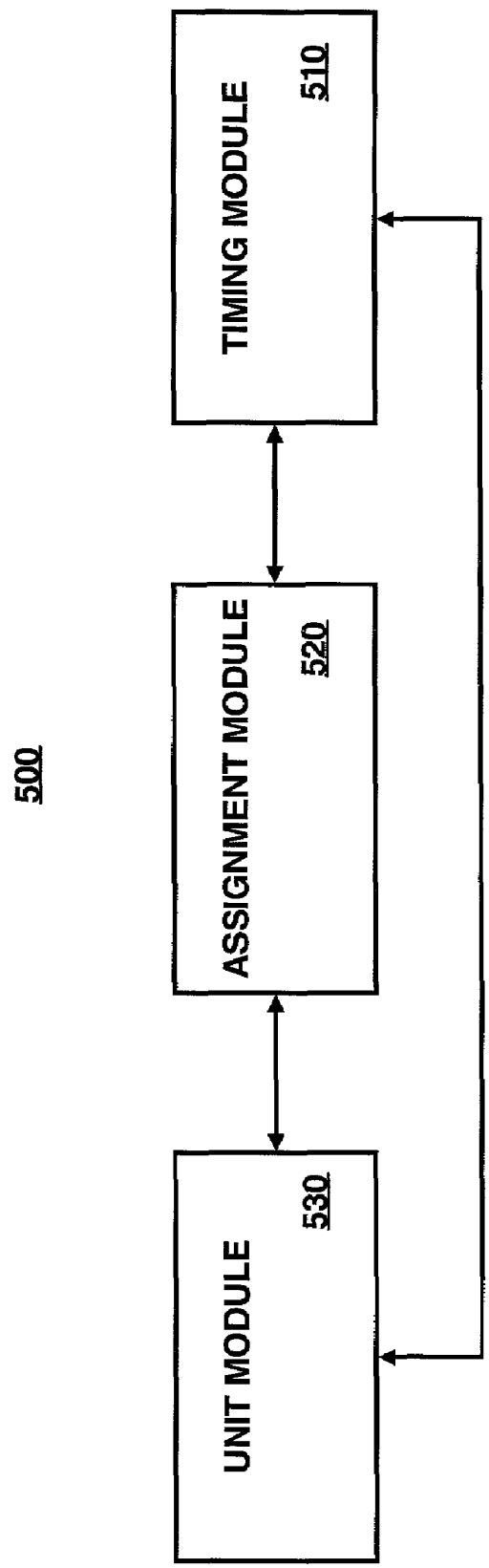
FIG. 5 depicts an exemplary system capable of being utilized to design electronic devices to reduce leakage power consumption while meeting the performance requirements.

The methods may be performed by an exemplary system 500 as shown in FIG. 5. The system 500 may include a unit module 530 configured to determine the units of an electronic device. The system 500 may also include a timing module 510 configured to determine the timing requirements of the units determined by the unit module 530. The system 500 may further include an assignment module 520 configured to assign the threshold voltages and/or sizes of the transistors of the units as necessary to meet the timing requirements set by the timing module 510.

While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations. In particular, although the method of the present invention has been described by examples, the steps of the method may be performed in a different order than illustrated or simultaneously. Also, the labels given to the steps of the methods in the claims are for reference purposes only. Unless otherwise specified, the labels given to the steps of the method claims do not imply any ordering of the steps. Those skilled in the art will recognize that these and other variations are possible within the spirit and scope of the invention as defined in the following claims and their equivalents.

What is claimed is:

1. A method to reduce leakage power in an electronic device, comprising:
   grouping transistors of the device into unit, wherein the grouping comprises
   determining a granularity for a unit size, wherein the granularity ranges from a single transistor to a functional unit, and
   grouping the transistors into the units, each unit having a size of the determining granularity;
   determining timing requirements for each unit; and
   assigning a threshold voltage and a fabrication width for one or more transistors of each units based on the timing requirements for each unit, wherein assigning a fabrication width further comprises
   determining the time requirements for each unit;
   matching the timing requirements for each unit with at least one type of transistor of a plurality of transistors, wherein each of the plurality of types of transistors has a current drive capability, fabrication width and threshold voltage appropriate for satisfying predetermined timing requirements; and
   for each unit selecting one of the matching types of transistors to be used for the one or more transistors in the unit, wherein the selected one of the matching types of transistors is selected to satisfy the timing requirements of the unit and to minimize leakage current.

2. The method of claim 1, wherein the granularity range includes single gates.

3. The method of claim 2, wherein:
   the simple gates includes at least one of MUX, AND gate, a NAND gate, OR gate, NOR gate, a latch, a buffer, and an inverter.

4. The method of claim 1, wherein grouping transistors, determining timing requirements, and assigning a threshold voltage and a fabrication width are performed prior to manufacturing the device.

5. The method of claim 1, wherein the plurality of types of transistors comprise three or more of overdrive low threshold transistors, regular low threshold transistors, underdrive low threshold transistors, overdrive normal threshold transistors, regular normal threshold transistors, and underdrive normal threshold transistors.

6. A system to reduce power consumption of an electronic device, comprising:
   means for grouping transistors into units, each unit having a size of a determined granularity wherein the granularity ranges from a single transistor to a functional unit;
   means for determining timing requirements for the units; and
   means for assigning threshold voltages and sizes for one or more transistors of each units based on the timing requirements, wherein the means for assigning is further operable for
      matching the timing requirements for each unit with at least one type of transistor of a plurality of transistors, wherein each of the plurality of type of transistors has a current drive capability, fabrication width and threshold voltage appropriate for satisfying predetermined timing requirements; and
      for each unit selecting one of the matching types of transistors to be used for the one or more transistors in the unit, wherein the selected one of the matching types of transistors is selected to satisfy the timing requirements of the unit and to minimize leakage current.

7. The system of claim 6, wherein the granularity range includes simple gates.

8. The system of claim 7, wherein the simple gates includes at least one of MUX, AND gate; a NAND gate, OR gate, NOR gate, a latch, a buffer, and an inverter.

9. The system of claim 6, wherein the means for assigning comprises means for assigning the threshold voltages and the sizes for the one or more transistors prior to manufacturing the electronic device.

10. The system of claim 6, wherein the plurality of types of transistors comprise three or more of overdrive low threshold transistors, regular low threshold transistors, underdrive low threshold transistors, overdrive normal threshold transistors, regular normal threshold transistors, and underdrive normal threshold transistors.

11. A method to reduce leakage power in an electronic device, comprising:
   determining timing requirements for one or more transistors of the device; and
   assigning a threshold voltage and a fabrication width for each of the one or more transistors whose timing requirements have been determined so that timing requirements are met while leakage power is minimized, wherein assigning a fabrication width further comprises
      matching the timing requirements for each of the one more transistors with at least one type of transistor of a plurality of transistors, wherein each of the plurality of types of transistors has a current drive capability, fabrication width and threshold voltage appropriate for satisfying predetermined timing requirements; and
      for each of the one or more transistors, selecting one of the matching types of transistors to be used for the transistor, wherein the selected one of the plurality of types of transistors is selected to satisfy the timing requirements of the transistor and to minimize leakage current.

12. The method of claim 11, wherein one or more subsets of the transistors of the device are defaulted to be a predetermined transistor type.

13. The method of claim 11, wherein determining timing requirements and assigning a threshold voltage and a fabrication width are performed prior to manufacturing the electronic device.

14. The method of claim 11, wherein the plurality of types of transistors comprise three or more of overdrive low threshold transistors, regular low threshold transistors, underdrive low threshold transistors, overdrive normal threshold transistors, regular normal threshold transistors, and underdrive normal threshold transistors.

* * * * *